US009658262B2

(12) United States Patent
Brunner

(10) Patent No.: US 9,658,262 B2
(45) Date of Patent: May 23, 2017

(54) RF POWER MEASUREMENT WITH BI-DIRECTIONAL BRIDGE

(75) Inventor: Eberhard Brunner, Waakirchen (DE)

(73) Assignee: ANALOG DEVICES, INC., Norwood, MA (US)

( * ) Notice: Subject to any disclaimer, the term of this patent is extended or adjusted under 35 U.S.C. 154(b) by 1397 days.

(21) Appl. No.: 13/473,558

(22) Filed: May 16, 2012

(65) Prior Publication Data

US 2013/0106440 A1    May 2, 2013

Related U.S. Application Data

(60) Provisional application No. 61/552,601, filed on Oct. 28, 2011.

(51) Int. Cl.
*G01R 21/12* (2006.01)

(52) U.S. Cl.
CPC .................... *G01R 21/12* (2013.01)

(58) Field of Classification Search
None
See application file for complete search history.

(56) References Cited

U.S. PATENT DOCUMENTS

| 3,197,696 | A | 7/1965 | Bibo |
| 4,110,685 | A | 8/1978 | Leenerts |
| 4,525,678 | A | 6/1985 | Lehmann et al. |
| 4,739,515 | A | 4/1988 | Herzog |
| 5,121,067 | A | 6/1992 | Marsland |
| 5,847,624 | A | 12/1998 | Pritchett |
| 6,492,933 | B1 | 12/2002 | McEwan |
| 7,309,994 | B2* | 12/2007 | Ehlers ................ G01R 27/28 324/610 |
| 7,495,511 | B2 | 2/2009 | Gilbert et al. |
| 2002/0113601 | A1* | 8/2002 | Swank, II ............ G01R 27/06 324/637 |
| 2007/0290757 | A1 | 12/2007 | Gilbert et al. |
| 2010/0231236 | A1 | 9/2010 | Harrison |
| 2011/0057746 | A1* | 3/2011 | Yamamoto ............ H01P 5/18 333/116 |

OTHER PUBLICATIONS

International Search Report and Written Opinion issued in PCT/US2012/059777 mailed Jan. 4, 2013, 14 pages.
Agilent Technologies, "Agilent 83036C Coaxial GaAs Directional Detector," Data Sheet, Aug. 7, 2001, 4 pages.

(Continued)

*Primary Examiner* — Melissa Koval
*Assistant Examiner* — Felicia Farrow
(74) *Attorney, Agent, or Firm* — Patent Capital Group

(57) ABSTRACT

A bi-directional bridge includes a forward bridge portion, and reverse bridge portion and a shared portion that enables the simultaneous measurement of power flowing in both directions while reducing insertion losses, providing better impedance matching and/or providing improved directionality. In some embodiments, additional attenuation is provided to reduce the common mode rejection requirements of detectors used with the bridge. In other embodiments, multi-tap attenuators and steering circuits may be integrated into the forward and/or reverse bridge portions to reduce common mode signal levels while still maintaining high levels of sensitivity for measuring small input signals.

29 Claims, 13 Drawing Sheets

(56) References Cited

OTHER PUBLICATIONS

Agilent Technologies, "Agilent RF and Microwave Test Accessories," Catalog 2006/07, 2005, 234 pages.
Agilent Technologies, "Agilent RF & Microwave Broadband Directional Detectors," Quick Fact Sheet, Aug. 23, 2010, 2 pages.
Anritsu Company, "Series 560-9XXX and 5400-6XXXX SWR Autotesters Operation and Maintenance Manual," Oct. 1997, 15 pages.
ST Microelectronics, "CPL-WB-01C2, Wide band directional coupler with ISO port," Data Sheet, Jan. 2010, 8 pages.
Skyworks Solutions Inc., "DD02-999LF: 650 MHz-3 GHz Directional Detector," Data Sheet, Dec. 4, 2008, 6 pages.
Analog Devices, "50 MHz to 9 GHz 65 dB TruPwr Detector—ADL5902," Data Sheet, 2010, 28 pages.
Anritsu Company, "Convertible SWR Autotester 560-98C50A" Data Sheet, Sep. 25, 2011, 1 page.
Agilent Technologies, "Agilent RF and Microwave Test Accessories," Data Sheet, 2000, 5 pages.
Anritsu Company, "SWR Autotesters 560-97 series," Data Sheet, Sep. 25, 2011, 1 page.

* cited by examiner

RF POWER MEASUREMENT WITH BI-DIRECTIONAL BRIDGE

CROSS-REFERENCE TO RELATED APPLICATION

This application claims priority to U.S. Provisional Patent Application Ser. No. 61/552,601 filed Oct. 28, 2011.

BACKGROUND

FIG. 1 illustrates a prior art arrangement for measuring the amount of radio frequency (RF) power transmitted from an RF power amplifier (PA) 10, to an antenna 12 through a transmission line 13. A directional coupler 14 diverts a small portion of the power to a detector 16 which measures the power transferred in the forward direction.

In some applications, both the forward and reverse (reflected) power must be measured simultaneously, for example, to determine the voltage standing wave ratio (VSWR). FIG. 2 illustrates how two directional couplers 14 and 18 may be arranged in series. One directional coupler 14 enables the first detector 16 to measure the forward power, while the other directional coupler 18 enables a second detector 20 to measure the reverse power.

Directional couplers tend to have low insertion loss, i.e., the loss in power resulting from the insertion of the coupler into the transmission line, because they have low series resistance. The insertion loss of a typical directional coupler may be about 0.1-0.2 dB. However, they also tend to be narrowband devices which restricts their use to applications where the signals to be measured fall within a relatively narrow frequency range, for example, from several hundred megahertz (MHz) to a few gigahertz (GHz).

FIG. 3 illustrates a prior art arrangement in which a directional bridge 22 is used in place of a coupler. Directional bridges are resistor bridges that are designed to divert a portion of the transmitted signal traveling in one direction to a detector. Because they are fabricated from resistive materials, they are inherently broadband devices that can operate over very wide frequency ranges, for example, from essentially DC to tens of GHz where the upper end is limited by parasitics. The resistive nature of a directional bridge, however, typically results in relatively high insertion loss, for example, 1.0-2.0 dB. Although the insertion loss of a single directional bridge is typically tolerable, if power must be measured in both directions, the use of two opposing, series-connected directional bridges introduces an unacceptable level of insertion loss.

DETAILED DESCRIPTION

Figure 1:
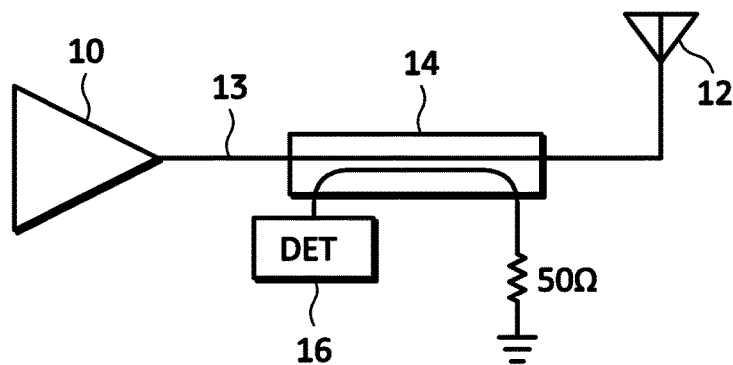
FIG. 1 illustrates a prior art transmission system having a single directional coupler.
Figure 2:
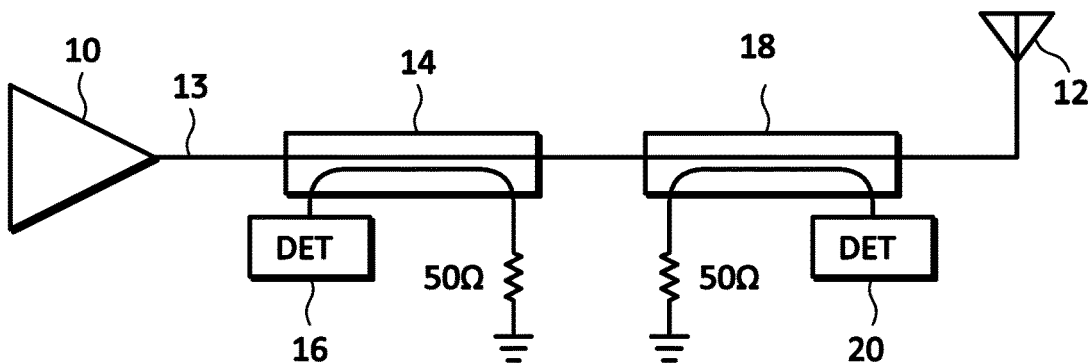
FIG. 2 illustrates a prior art transmission system having forward and reverse directional couplers connected in series.
Figure 3:
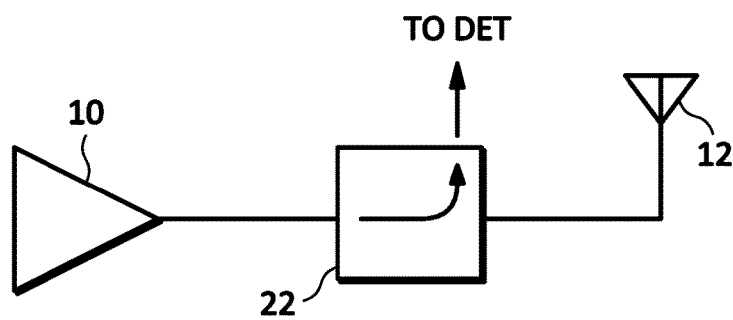
FIG. 3 illustrates a prior art transmission system having a directional bridge.
Figure 4:
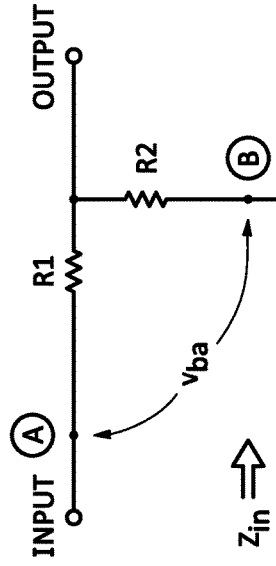
FIG. 4 illustrates the construction of a prior art directional bridge.

FIG. 4 illustrates the construction of a prior art directional bridge and detector combination that may be used, for example, as the directional bridge 22 shown in FIG. 3. Because the diode detector D1 has a high input impedance over the relevant frequency range, the circuit of FIG. 4 can be approximated by the circuit of FIG. 5. The following analysis illustrates how the circuit of FIG. 5 enables the measurement of signals traveling through the bridge in only the forward direction.

Figure 6:
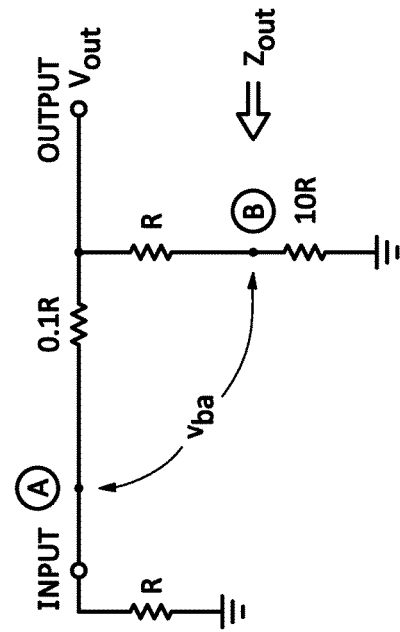
FIG. 6 illustrates a technique for determining the input impedance of the bridge of FIG. 4.

First, the input impedance $Z_{in}$ looking into the input terminal is determined when a load or transmission line having a characteristic impedance R is coupled to the output terminal as shown in FIG. 6. Using the values R1=0.1R, R2=R and R3=10R, it can be shown that the input impedance $Z_{in}$ is given by $$Z_{in} = 1.02R \quad \text{(Eq. 1)}$$

The detector measures the voltage $V_{ba}$ between points A and B, and using the same values of R1, R2 and R3, it can be shown that the measured voltage Vba is given by $$V_{ba} = 0.181 V_{in} \quad \text{(Eq. 2)}$$

Figure 7:
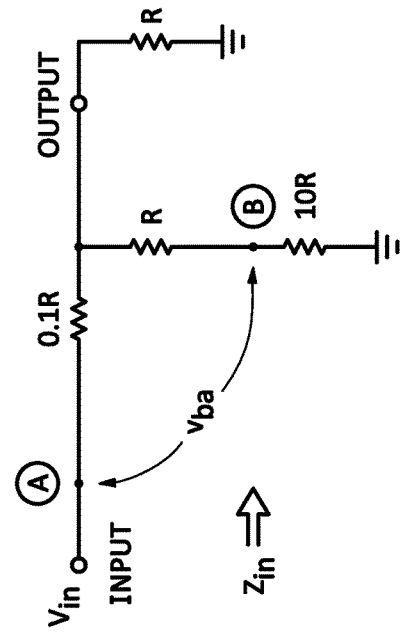
FIG. 7 illustrates a technique for determining the output impedance of the bridge of FIG. 4.

Next, the output impedance Zout looking into the output terminal is determined when a load or transmission line having a characteristic impedance R is coupled to the input terminal as shown in FIG. 7. Using the same values of R1=0.1R, R2=R and R3=10R, it can be shown that the output impedance Zout is given by $$Z_{out} = R \quad \text{(Eq. 3)}$$

and the measured voltage $V_{ba}$ is given by $$V_{ba} = 0 \quad \text{(Eq. 4)}$$

Thus, the directivity is theoretically infinite because the bridge measures some positive value of $V_{ba}$ for a signal traveling in the forward direction, while it measures no signal (Vba=0) for a reflected or backward traveling signal.

Figure 5:
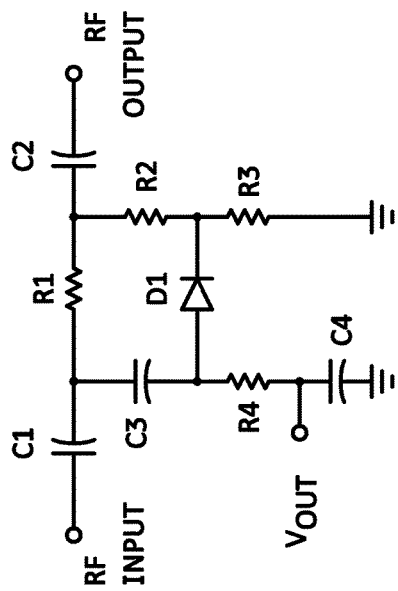
FIG. 5 illustrates an approximation of the bridge of FIG. 4.

The bridge of FIG. 5 also provides good impedance matching in both directions, with theoretically perfect matching in the reverse direction (Zout=R), and only about a two percent mismatch ($Z_{in}$=1.02R) in the forward direction.

The insertion loss of the bridge of FIG. 5 is determined primarily by the value of R1, and to a lesser extent by the values of R2 and R3. In an implementation with 50 ohm source and load impedances, i.e., R=50Ω, the series resistor R1 has a value of 5 ohms which typically results in an insertion loss of about 1-1.5 dB over the operating frequency range which may be about 0.01 to 25 GHz.

As mentioned above, a common parameter that must be measured in RF systems is the voltage standing wave ratio (VSWR) which is defined as follows:

$$VSWR = \frac{1 + |\Gamma|}{1 - |\Gamma|} \quad \text{(Eq. 5)}$$

where Γ (uppercase Greek letter gamma) is the reflection coefficient (return loss) which has an absolute value defined as the difference between the power of the forward signal and the power of the reverse signal:

$$P_{forward} - P_{reverse} = |\Gamma| \quad \text{(Eq. 6)}$$

Thus, to measure VSWR, it is necessary to simultaneously measure the power of signals traveling in both directions. However, because the directional bridge described above with respect to FIGS. 4-7 can only measure power in one direction, two identical bridges would have to be connected in series, facing opposite directions, to obtain the two power measurements needed to determine the VSWR for a system. This, in turn, would result in double the insertion loss.

Figure 8:
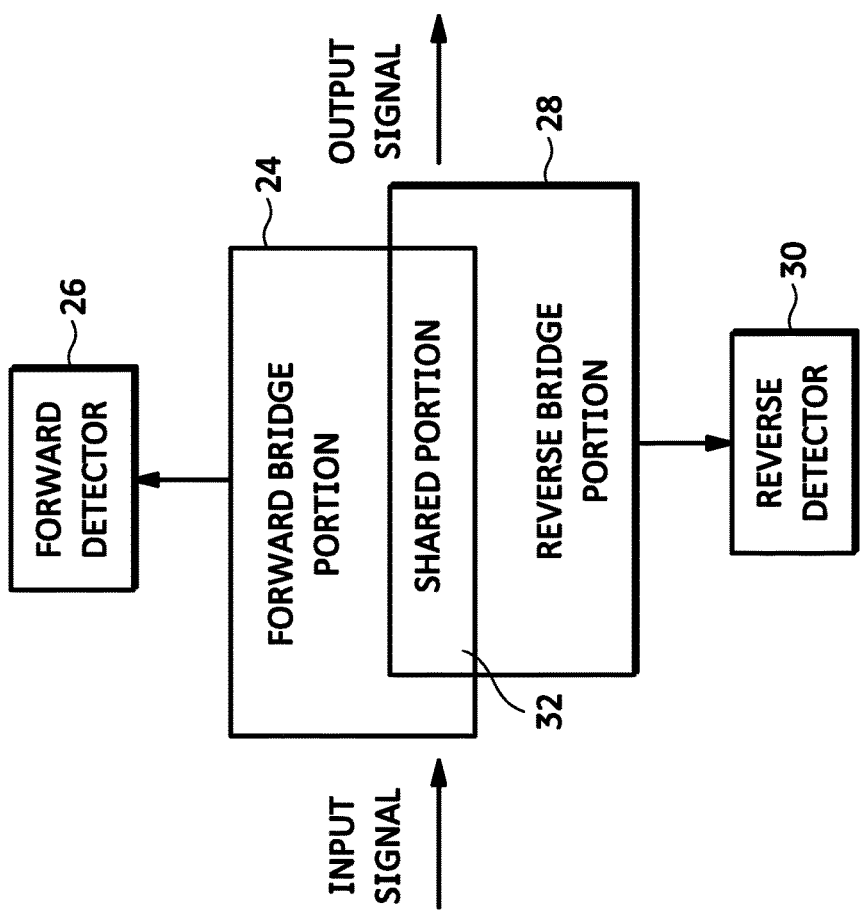
FIG. 8 illustrates an embodiment of a multi-directional bridge according to some inventive principles of this patent disclosure.

FIG. 8 illustrates an embodiment of a multi-directional bridge according to some inventive principles of this patent disclosure. The embodiment of FIG. 8 includes a forward bridge portion 24 that enables the measurement of a forward signal (e.g., the forward signal from an RF signal source, such as a PA, to an antenna, as discussed above and illustrated in FIGS. 3 and 5) by a forward detector 26, and a reverse bridge portion 28 that enables the measurement of a reverse signal (e.g., the reverse signal from an antenna to an RF signal source, such as a PA, as discussed above and illustrated in FIGS. 3 and 5) by a reverse detector 30. The forward and reverse portions, however, have a shared portion 32 which simultaneously functions as a major component of both the forward and reverse portions. The multi-function characteristic of the shared portion may impart one or more beneficial characteristics to the bridge such as reducing insertion losses, providing better impedance matching, improving directionality, etc. The forward and reverse bridge portions 24 and 28 may include any suitable arrangement of components such as resistors, capacitors, inductors, etc., that implement two bridges that enable simultaneous measurement of forward and reverse flowing signals.

Figure 9:
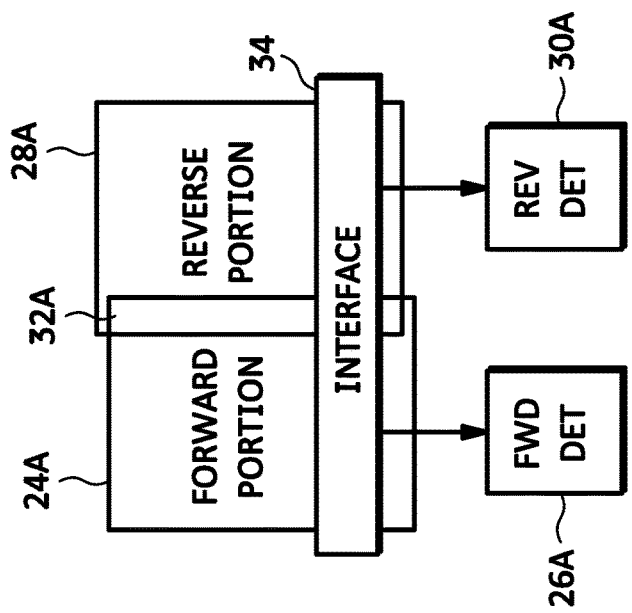
FIG. 9 illustrates another embodiment of a multi-directional bridge according to some inventive principles of this patent disclosure.

FIG. 9 illustrates another embodiment of a multi-directional bridge according to some inventive principles of this patent disclosure. The embodiment of FIG. 9 includes forward and reverse bridge portions 24A and 28A having a shared portion 32A, and forward and reverse detectors 26A and 30A similar to those of the embodiment of FIG. 8, but with the addition of an interface circuit 34 that interfaces the forward and reverse bridge portions to the detectors. The interface circuit 34 may, for example, shift one or more signal levels to reduce the common mode rejection (CMR) requirements of one or more of the detectors. As another example, the interface circuit may attenuate one or more signals to change the common mode level, provide better impedance matching or more accurate scaling of the signal detection process. As a further example, the interface circuit may convert between voltage-mode and current-mode signals to enable the use of current-input detectors with voltage-mode bridge portions, or vice-versa.

Figure 10:
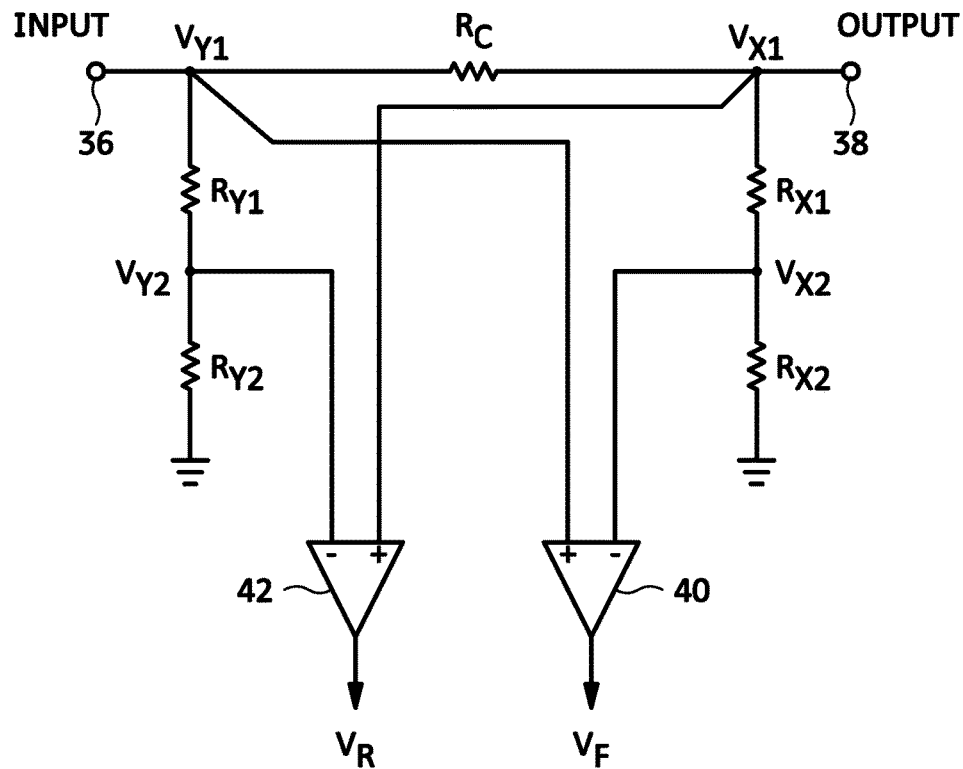
FIG. 10 illustrates an embodiment of a bi-directional bridge according to some inventive principles of this patent disclosure.

FIG. 10 illustrates an embodiment of a bi-directional bridge according to some inventive principles of this patent disclosure. The embodiment of FIG. 10 is one example of a more detailed implementation of the embodiment of FIG. 8. The embodiment of FIG. 10 includes a shared or common sense resistor $R_C$ connected between the input and output terminals 36 and 38. A first string of shunt resistors $R_{X1}$ and $R_{X2}$ is connected between one side of $R_C$ and a common or ground node GND. A second string of shunt resistors $R_{Y1}$ and $R_{Y2}$ is connected between the other side of $R_C$ and GND. A first detector 40 generates an output signal $V_F$ that provides a measure of the forward power, while a second detector 42 generates an output signal $V_R$ that provides a measure of the reverse power.

Thus, the embodiment of FIG. 10 includes two overlapping directional bridges that face in opposite directions. The shared sense resistor $R_C$ and the first string of shunt resistors $R_{X1}$ and $R_{X2}$ form a first directional bridge which, along with the first detector 40, measures the forward power. Simultaneously, the shared sense resistor $R_C$ and the second string of shunt resistors $R_{Y1}$ and $R_{Y2}$ form a second directional bridge which, along with the second detector 42, measures the reverse power.

Because the two overlapping directional bridges share the common sense resistor RC, a bi-directional bridge can be implemented, but the insertion loss is only one-half of the insertion loss that would be associated with using two full directional bridges, each having a sense resistor $R_C$, connected in series. That is, both the forward and reverse measurements may be obtained simultaneously, but the insertion loss penalty is paid only once.

Selecting suitable values for $R_C$, $R_{X1}$, $R_{X2}$, $R_{Y1}$ and $R_{Y2}$ may involve balancing of various factors depending on the specific application. Some techniques for selecting component values according to the inventive principles of this patent disclosure will be illustrated by calculating example values of $R_C$, $R_{X1}$, $R_{X2}$, $R_{Y1}$ and $R_{Y2}$ for a bi-directional bridge that is to be used with a source impedance $R_S$ and a load impedance $R_L$ as shown in FIG. 11.

Figure 11:
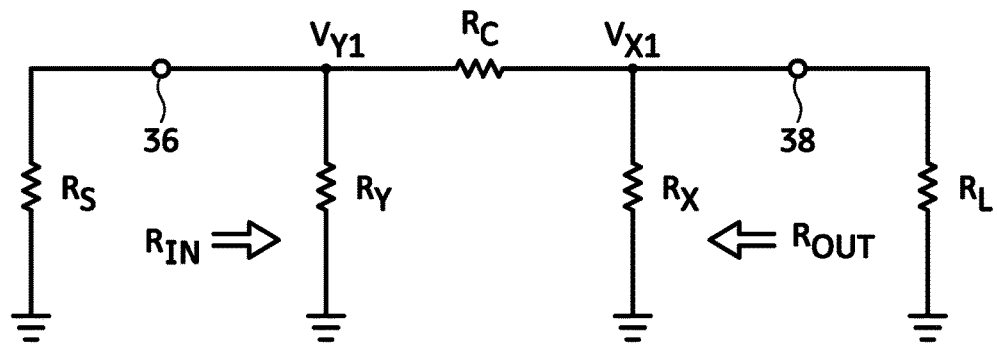
FIG. 11 illustrates the bridge of FIG. 10 with simplified components.

FIG. 11 illustrates the bridge of FIG. 10 with the series combination of $R_{Y1}$ and $R_{Y2}$ shown as a simplified resistor $R_Y$, and the series combination of $R_{X1}$ and $R_{X2}$ shown as a simplified resistor $R_X$. That is, $R_{Y1}+R_{Y2}=R_Y$ and $R_{X1}+R_{X2}=R_X$.

Maximum power transfer is obtained when the input impedance $R_{IN}$ equals the source impedance $R_S$, and the output impedance $R_{OUT}$ equals the load impedance $R_L$. Also, for measurement symmetry, it is assumed that $R_Y=R_X$, $R_S=R_L$, and $R_{IN}=R_{OUT}$. Thus, for $R_{IN}=R_S=R_L=R_{OUT}$, it can be shown that $$R_X = \frac{R_L^2 \pm R_L^2 \sqrt{1 + R_C/R_L}}{R_C} \tag{Eq. 7}$$

To apply Eq. 7, a suitable value for RC is first selected. Assuming $R_S=R_L=50$ ohms, a value of $R_C=5\Omega$ is selected to keep the insertion loss below 1 dB. Plugging these values for $R_L$ and $R_C$ into Eq. 7 and discarding the ± option that produces a negative value yields the following result $$R_Y=R_X=1024.4\Omega \tag{Eq. 8}$$

which provides ideal input and output impedance matching.

After suitable values for $R_X$ and $R_Y$ have been determined, the individual values of $R_{Y1}$, $R_{Y2}$, $R_{X1}$ and $R_{X2}$ can be determined. Referring to FIG. 10, theoretically perfect directivity is achieved when values of $R_{Y1}$, $R_{Y2}$, $R_{X1}$ and $R_{X2}$ are selected so that a forward traveling signal is completely nulled at the input of the reverse detector 42, and a reverse traveling signal is completely nulled at the input of the forward detector 40. The first step in determining these values is to calculate an attenuation factor Attn1 from $V_{Y1}$ to $V_{X1}$. Referring back to FIG. 11, the value of Attn1 is determined by the voltage divider formed by $R_C$ in series with the parallel combination of $R_X$ and $R_L$ as follows:

$$Attn1 = \frac{R_X \| R_L}{R_C + R_X \| R_L} = \frac{R_X R_L/(R_X+R_L)}{R_C + R_X R_L/(R_X+R_L)} \tag{Eq. 9}$$

For $R_C=5$ ohms, $R_S=50$ ohms, and $R_X=1024.4$ ohms, Eq. 9 evaluates to Attn1=0.905. That is, for an input voltage $V_{Y1}$ applied to the input terminal 36, the voltage at $V_{X1}=0.905 \cdot V_{Y1}$, which also appears at the noninverting (+) input of the reverse detector 42.

Next, to assure zero differential voltage across the input terminals of the reverse detector 42, the voltage at $V_{Y2}$ must equal the voltage at $V_{X1}$. This is achieved when a second attenuation factor Attn2 from $V_{Y1}$ to $V_{Y2}$ is equal to Attn1, that is, when $$Attn1 = Attn2 = \frac{R_{Y2}}{R_{Y1}+R_{Y2}} \tag{Eq. 10}$$

In this example, Attn1=0.905, and $R_{Y1}+R_{Y2}=1024.4$. Thus, $R_{Y2}=927.1$ and $R_{Y1}=97.3$.

From these example values, it is apparent that the differential signal between $V_{Y1}$ and $V_{X2}$ (forward detector) and between $V_{X1}$ and $V_{Y2}$ (reverse detector) may be difficult to measure because the sensed signal is relatively small, but riding on a very large common mode signal. Thus, the detectors may need to have very high common mode rejection.

The embodiment of FIG. 10 may be well-suited for use with passive detectors such as diode detectors that do not have constraints such as power supply headroom, common mode rejection requirements, etc. In some implementations, however, it may be beneficial to use more sophisticated or active power detectors such as root-mean-square (RMS) detectors, logarithmic amplifiers (log amps), linear amplifiers, etc. These types of detectors include active circuitry that is constrained by dual or single-ended power supplies, and if the embodiment of FIG. 10 is to be used for measuring relatively high power signals, the signal levels involved may conflict with the available power supplies. For example, a +30 dBm input signal from a 50Ω source impedance has ±10 volt excursions (20 volts peak-to-peak), which may have to be processed by an active detector operating from a single or dual 3 or 5 volt power supply.

The demands placed on the detectors, however may be relaxed through the use of interface circuitry that may provide attenuation, level shifting, etc. as described below.

Figure 12:
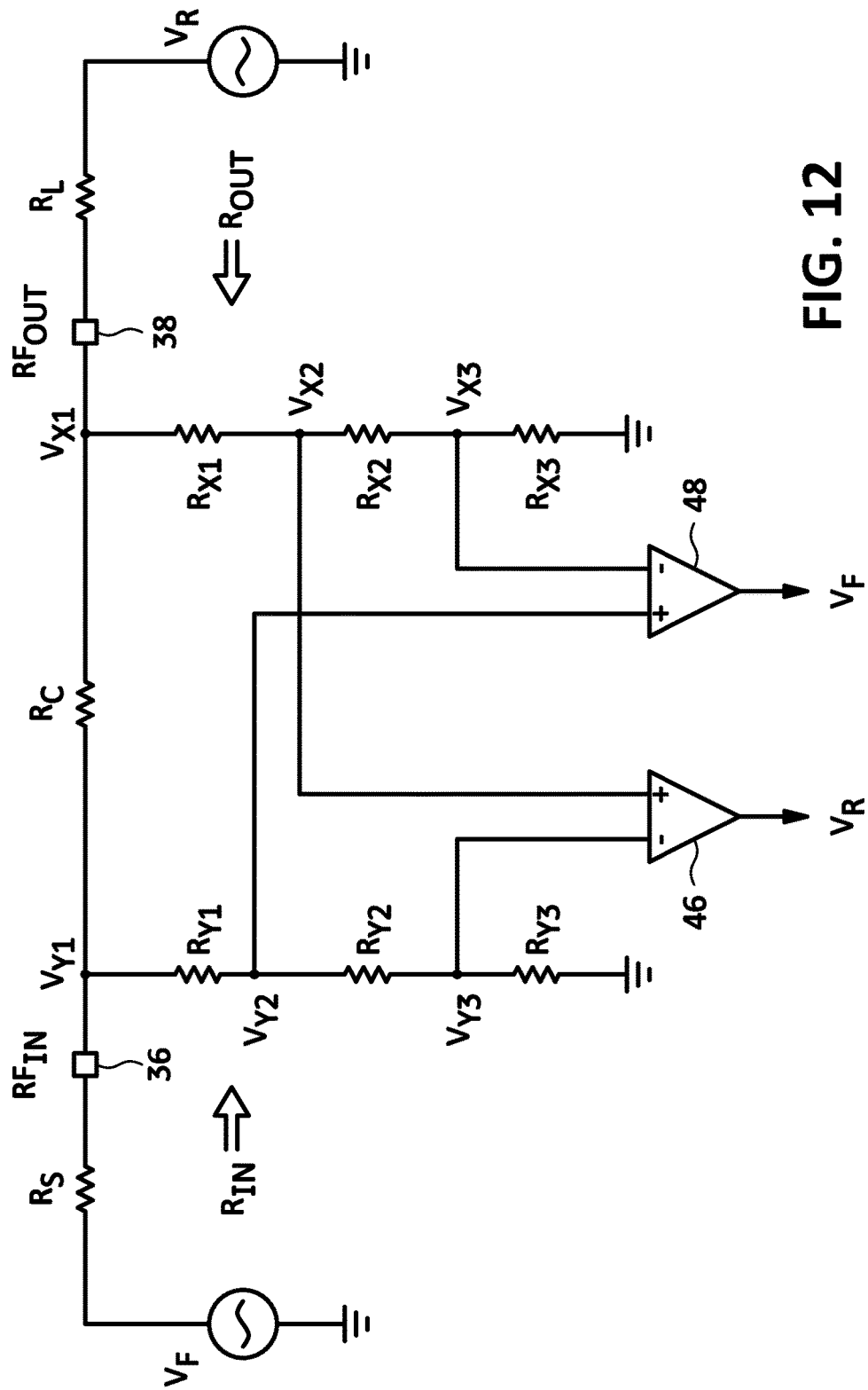
FIG. 12 illustrates another embodiment of a bi-directional bridge according to some inventive principles of this patent disclosure.

FIG. 12 illustrates another embodiment of a bi-directional bridge according to some inventive principles of this patent disclosure. The embodiment of FIG. 12 is one example of a more detailed implementation of the embodiment of FIG. 9 in which the shunt paths of the bridge are structured so that the detectors 46 and 48 see attenuated and level-shifted signals, thereby reducing the CMR requirements of the detectors and allowing them to operate at typical power supply voltages.

The first shunt path, which will be referred to as the X or $R_X$ shunt path, includes resistors $R_{X1}$, $R_{X2}$ and $R_{X3}$ connected in series. Likewise, the second shunt path, which will be referred to as the Y or $R_Y$ shunt path, includes resistors $R_{Y1}$, $R_{Y2}$ and $R_{Y3}$ connected in series.

Selecting values for $R_C$, as well as the X and Y shunt paths may involve subtle balancing of various factors depending on the specific application. In the following example, some suitable component values will be determined for an embodiment in which the bi-directional bridge is fabricated on an integrated circuit (IC) chip on which input and output terminals $RF_{IN}$ and $RF_{OUT}$ are bond pads, and the source and load impedances $R_S$ and $R_L$ are assumed to be 50Ω.

To begin the process, a suitable value for $R_C$ is selected. In this example, a value of $R_C=5\Omega$ is selected to keep the insertion loss below 1 dB.

Next, the overall values of the X and Y shunt paths are selected to provide input and output impedance matching. Theoretically perfect matching is obtained when $R_S=R_{IN}$ and $R_{OUT}=R_L$. Measurement symmetry is maintained by setting $R_Y=R_X$, $R_S=R_L$, and $R_{IN}=R_{Out}$. If $R_X=R_{X1}+R_{X2}+R_{X3}$ and $R_Y=R_{Y1}+R_{Y2}+R_{Y3}$, then solving for $R_X$ in much the same manner as using Eq. 7 in the embodiment of FIGS. 10 and 11, the optimum value of $R_Y$ (and thus $R_X$) is again determined to be 1024.4Ω.

Next, the individual values of $R_{Y1}$, $R_{Y2}$ and $R_{Y3}$ (and thus $R_{X1}$, $R_{X2}$ and $R_{X3}$) are selected. This involves two primary determinations. First, a common mode attenuation factor from $V_{Y1}$ to $V_{Y2}$ (and $V_{X1}$ to $V_{X2}$) is selected to bring the voltage levels at $V_{Y2}$ and $V_{X2}$ down to a level that provides a manageable common mode input for the detectors 46 and 48. Second, the relative values of $R_{Y2}$ and $R_{Y3}$ (and $R_{X2}$ and $R_{X3}$) are selected to provide adequate directivity.

The common mode attenuation factor from $V_{Y1}$ to $V_{Y2}$, which will be referred to as AttnCM, is determined by the following equation:

$$AttnCM = \frac{R_{Y2}+R_{Y3}}{R_{Y1}+R_{Y2}+R_{Y3}} \tag{Eq. 11}$$

To provide optimum directivity, the reverse detector 46 should see zero volts across its inputs in response to a forward traveling signal at the $RF_{IN}$ terminal 36. Optimizing the directivity involves defining two more attenuation factors: Attn1 is defined as the attenuation from $V_{Y1}$ to $V_{X1}$ (and $V_{X1}$ to $V_{Y1}$, where $R_S=R_L$):

$$Attn1 = \frac{R_X \| R_L}{R_C + R_X \| R_L} = \frac{R_X R_L/(R_X + R_L)}{R_C + R_X R_L/(R_X + R_L)} \quad \text{(Eq. 12)}$$

where $R_X = R_{X1} + R_{X2} + R_{X3}$, and Attn2 is defined as the attenuation from $V_{Y2}$ to $V_{Y3}$ (and $V_{X2}$ to $V_{X3}$):

$$Attn2 = \frac{R_{Y3}}{R_{Y2} + R_{Y3}} \quad \text{(Eq. 13)}$$

Referring to FIG. 12, it is apparent that the reverse detector 46 sees zero volts across its inputs when $V_{Y3}=V_{X2}$. Using the attenuation factors defined above:

$$V_{Y3}=V_{Y1} \cdot AttnCM \cdot Attn2 \quad \text{(Eq. 14)}$$

and $$V_{X2}=V_{Y1} \cdot Attn1 \cdot AttnCM \quad \text{(Eq. 15)}$$

Setting $V_{Y3}=V_{X2}$ yields:

$$Attn1=Attn2 \quad \text{(Eq. 16)}$$

for optimum directivity.

One approach to selecting values for $R_{Y1}$, $R_{Y2}$ and $R_{Y3}$ is to use brute force calculations to determine exact values. For example, as determined above, ideal input and output impedance matching is achieved when $R_X=1024.4$ ohms. Assuming $R_C=5$ ohms and $R_L=50$ ohms, (Eq. 12) evaluates to Attn1=0.905. Since optimum directivity is achieved when Attn1=Attn2, a common mode attenuation factor AttnCM may be chosen, then (Eq. 11) and (Eq. 13) may be solved to determine exact values for $R_{Y1}$, $R_{Y2}$ and $R_{Y3}$.

Some additional observations, however, may provide a more nuanced approach to selecting values that are more amendable to fabrication in monolithic form. First, the absolute values of $R_X$ (and $R_Y$) may be varied somewhat while still providing adequate input and output impedance matching. Second, the exact value of the common mode attenuation factor AttnCM is typically not important as long as the input signal at $V_{Y1}$ is attenuated enough to bring the voltage at $V_{Y2}$ down to a low enough level that is within the CMR range of the detector 46. Third, although the absolute values of $R_X$ (and $R_Y$) are typically not important, the relative values of $R_X$ and $R_Y$ will typically need to be matched closely to provide adequate performance, and when designing an integrated circuit, matching is often achieved by using unit resistors.

Therefore, another approach to selecting values for $R_{Y1}$, $R_{Y2}$ and $R_{Y3}$ involves making some educated guesses at resistor values using unit resistors, then iteratively adjusting the values as illustrated with the following example which utilizes 100 ohm unit resistors.

As a starting point, assume the inputs to the detectors 46 and 48 can handle a common mode input voltage of about ±1.2 volts, and the bridge is intended to handle a 30 dBm input signal from a 50Ω source impedance which therefore has ±10 volt excursions. Also select $R_C=5$ ohms to keep the insertion loss less than 1 dB. Since $R_Y$ (that is, $R_{Y1}+R_{Y2}+R_{Y3}$) should be about 1024 ohms, and AttnCM must be about 0.12, a first guess for $R_{Y1}$ according to (Eq. 11) is 900 ohms, which means $R_{Y2}+R_{Y3}$ would have to be a little over 100 ohms.

From (Eq. 12), Attn1 is about 0.905. According to (Eq. 16), Attn1=Attn2 for optimum directivity, and thus, according to (Eq. 13), $R_{Y3}/(R_{Y2}+R_{Y3})=0.905$. Since $R_{Y2}+R_{Y3}$ should be a little over 100 ohms, and using values that can be obtained with 100 ohm unit resistors, first guesses for $R_{Y2}$ and $R_{Y3}$ are 10 ohms, and 100 ohms, respectively. Thus, the first guess is:

$R_{Y1}=900$ ohms
$R_{Y2}=10$ ohms
$R_{Y3}=100$ ohms.

Plugging these values into (Eq. 11) yields AttnCM≈0.11. That is, a ±10 volt input at $V_{Y1}$ is attenuated down to about ±1.1 volts at $V_{Y2}$, which is within the ±1.2 volt common mode input range of the detectors 46 and 48, so the attenuation factor is acceptable. As for impedance matching, $R_Y=R_{Y1}+R_{Y2}+R_{Y3}=900+10+100=1010$ ohms. This is within one percent of the theoretically perfect value of 1024.4 ohms, so the input and output impedance matching are acceptable.

Turning now to directivity, (Eq. 12) yields Attn1≈0.905 and (Eq. 13) yields Attn2≈0.909. It can be shown that these values yield a best case directivity of about 34 dB. This is a good value, but from (Eq. 13), it is apparent that the value of $R_{Y2}$ could be increased slightly for even better directivity.

Increasing the value of $R_{Y2}$ to 10.5 ohms (using 105 ohm unit resistors) essentially leaves the value of Attn1 unchanged at 0.905, but reduces the value of Attn2 to 0.905, thereby providing excellent directivity.

Thus, using the following final values for the embodiment of FIG. 12:

$R_{Y1}=900$ ohms
$R_{Y2}=10.5$ ohms
$R_{Y3}=100$ ohms provides a bi-directional bridge with a common mode voltage that is low enough to utilize readily available detectors, provides good input and output impedance matching, and is easy to fabricate on an integrated circuit using unit resistors that provide excellent matching between the two shunt paths of the bridge, as well as excellent directivity. Moreover, because the structure is a resistive bridge, it is inherently capable of broadband operation, where the lower end is DC and the upper end is only limited by parasitics.

Figure 13:
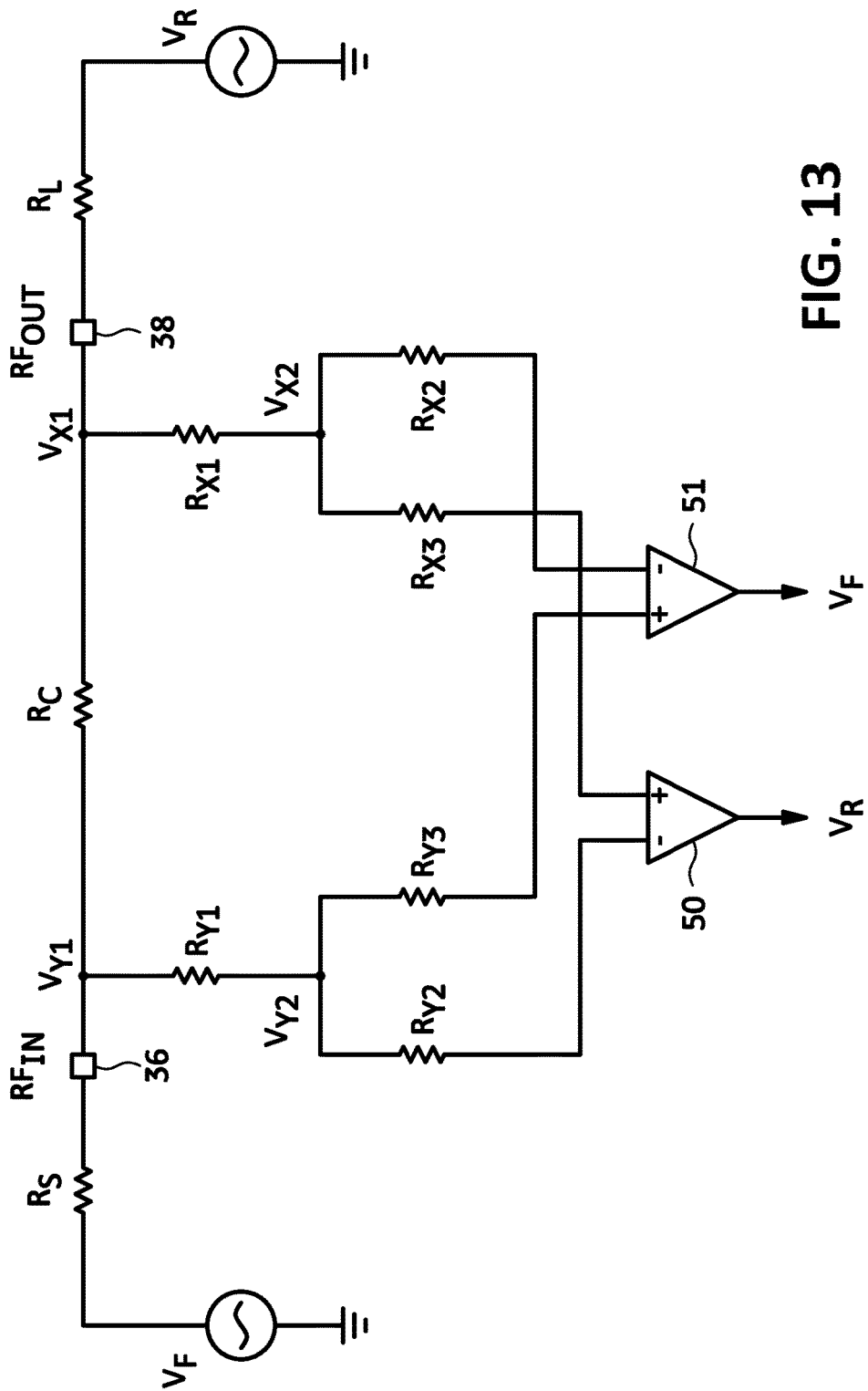
FIG. 13 illustrates another embodiment of a bi-directional bridge according to some inventive principles of this patent disclosure.

Examples of detectors suitable for use with the embodiments of FIGS. 9, 12, and 13 include diode detectors, logarithmic amplifiers (log amps), and root-mean-square (RMS) detectors, as well as linear amplifiers if there is a need to preserve amplitude and phase information.

Current Conversion

FIG. 13 illustrates another embodiment of a bi-directional bridge according to some inventive principles of this patent disclosure. The embodiment of FIG. 13 is another example of a more detailed implementation of the embodiment of FIG. 9, but in this embodiment, the measured signals are converted to current mode signals to reduce the necessary voltage swing that the detectors have to process.

The embodiment of FIG. 13 is similar to that of FIG. 12, but the lower portions of the shunt paths are arranged as parallel rather than series combinations of resistors to enable sensing the shunt path signals in the form of currents rather than voltages. In the Y shunt path, all of the current flows through resistor $R_{Y1}$. It then splits with a portion of the current flowing through $R_{Y2}$ into the inverting (−) input of reverse detector 50 and the rest of the current flowing through $R_{Y3}$ into the noninverting (+) input of forward detector 51. In the X shunt path, all of the current flows through resistor $R_{X1}$. It then splits with a portion of the current flowing through $R_{X2}$ into the inverting (−) input of reverse forward 51 and the rest of the current flowing through $R_{X3}$ into the noninverting (+) input of forward reverse detector 50.

Detectors 50 and 51 are configured with very low impedance inputs (current sinks) to implement an AC ground to absorb all of the current flowing through the current-splitting resistors $R_{Y2}$, $R_{Y3}$, $R_{X2}$ and $R_{X3}$. The output of each detector is a measure of the differential current at its inputs. Because the inputs are at AC ground, there is no common mode voltage to contend with. The common mode voltage is converted into differential currents via the CM voltage at $V_{Y2}$ and $V_{X2}$ applied across resistors $R_{X2}$, $R_{X3}$, $R_{Y2}$ and $R_{Y3}$.

Many of the same design considerations discussed above with respect to the embodiment of FIG. 12 may apply to the embodiment of FIG. 13. For example, an attenuation factor Attn1 can be defined from $V_{Y1}$ to $V_{X1}$:

$$\text{Attn1} = V_{X1}/V_{Y1} \quad (\text{Eq. 17})$$

It can be shown that, for optimum directionality in the embodiment of FIG. 13, the values of $R_{X3}$ and $R_{Y2}$ are related to the value of Attn1 as follows:

$$\frac{R_{X3}}{R_{Y2}} = \text{Attn1} \quad (\text{Eq. 18})$$

Parasitics and Packaging

Integrated circuits are mounted in packages that have inherent parasitic effects such as the resistance, inductance and capacitance of bond wires that connect bond pads on the IC chip to terminals or lead frames on the packages. These parasitics are generally detrimental to the operation of the chip, although they can sometimes be utilized to advantage as an extension of the circuit on the chip as disclosed, for example, in U.S. Pat. No. 6,046,640 by an inventor of this patent disclosure.

Figure 14:
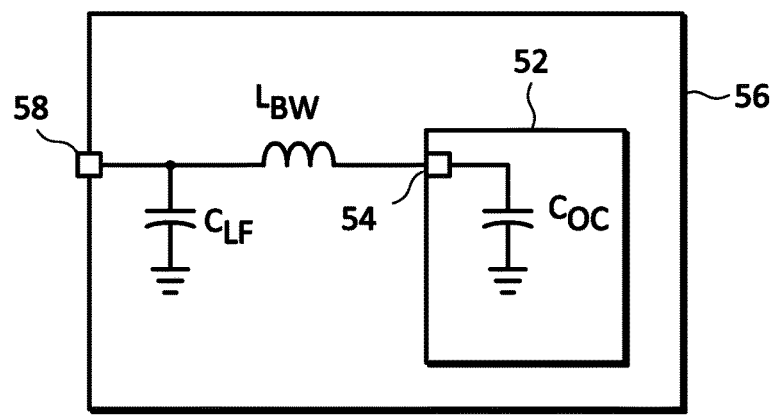
FIG. 14 illustrates a prior art packaging arrangement for an integrated circuit.

The use of packaging parasitics have previously been used in conjunction with a single terminal of an IC package. Referring to FIG. 14, a conventional packaging arrangement includes an IC chip 52 having a bond pad 54. The IC chip is mounted in a package 56 with a lead frame 58. The bond pad 54 is connected to the lead frame 58 through a bond wire having an inductance $L_{BW}$. The lead frame 58 has a parasitic capacitance $C_{LF}$.

Rather than letting the bond wire inductance and lead frame capacitance exercise an uncontrolled influence over the operation of the chip, an on-chip capacitor $C_{OC}$ is added to the integrated circuit. The value of $C_{OC}$ is tuned so that the combination of $C_{LF}$, $L_{BW}$, and $C_{OC}$ form a maximally flat, third-order, low pass filter. The filter is third-order because it includes three reactive components.

The architecture of a bi-directional bridge according to the inventive principles of this patent disclosure enables the implementation of higher-order filters using packaging parasitics according to some additional inventive principles of this patent disclosure.

Figure 15:
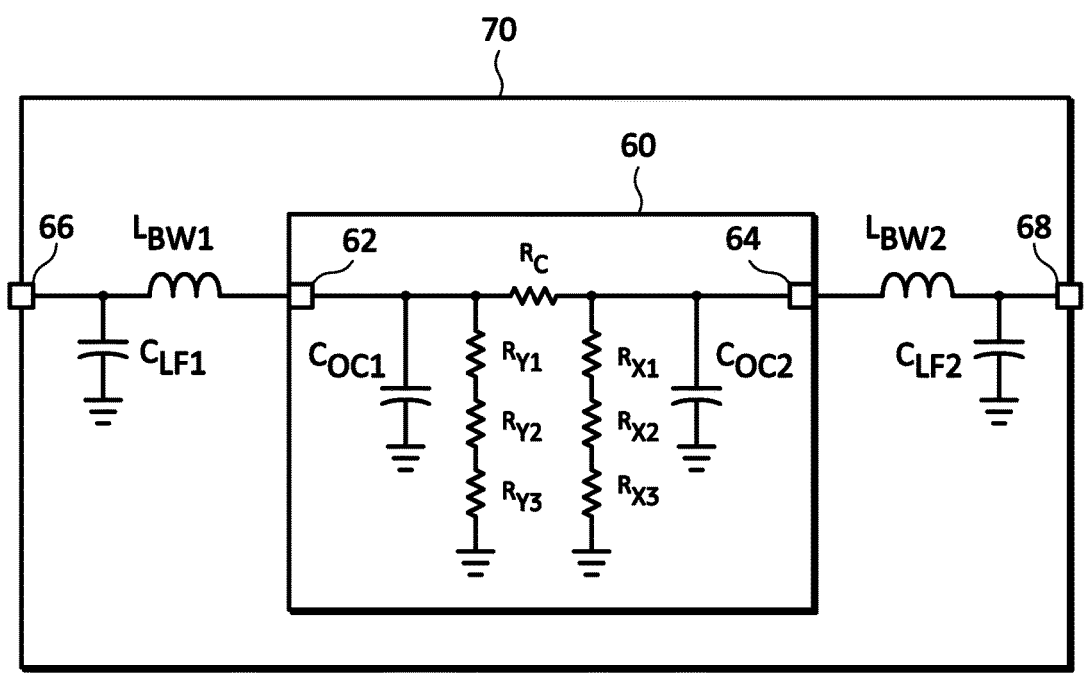
FIG. 15 illustrates an embodiment of a packaging arrangement for an integrated circuit according to some inventive principles of this patent disclosure.

FIG. 15 illustrates an embodiment of a packaging arrangement for an integrated circuit according to some inventive principles of this patent disclosure. An integrated circuit 60 includes a bi-directional bridge having resistors $R_C$, $R_{Y1}$, $R_{Y2}$, $R_{Y3}$, $R_{X1}$, $R_{X2}$ and $R_{X3}$ as in embodiments described above. The IC includes bond pads 62 and 64 which provide access to the input and output terminals of the bridge. The bond pads 62 and 64 are coupled to lead frames 66 and 68 of a package 70 through bond wires having inductances $L_{BW1}$ and $L_{BW2}$, respectively. Lead frames 66 and 68 have parasitic capacitances $C_{LF1}$ and $C_{LF2}$, respectively.

Figure 16:
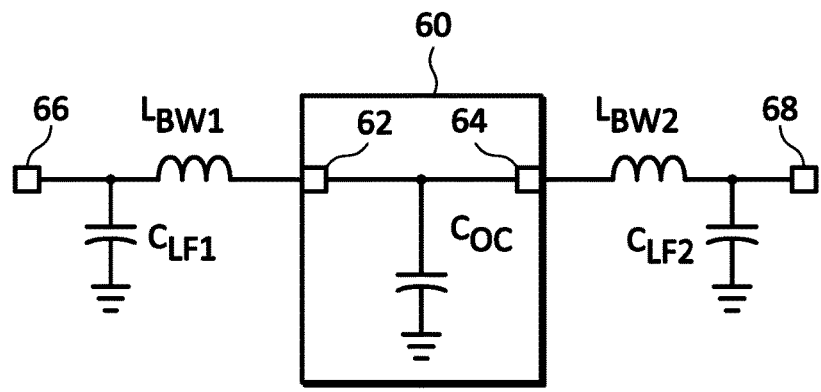
FIG. 16 illustrates one technique for modeling the embodiment of FIG. 15.

By including additional on-chip capacitors $C_{OC1}$ and $C_{OC2}$, which can also be part of the parasitic capacitance, at or near the bond pads 62 and 64, a fifth-order or higher low-pass filter can be realized. The structure of the filter can be conceptualized as flowing through the chip. Because the value of $R_C$ is relatively small, the two on-chip capacitors $C_{OC1}$ and $C_{OC2}$ can be modeled as a single capacitor $C_{OC}$ as shown in FIG. 16. Thus, by including capacitors having suitable values on an IC having a bi-directional bridge according to the inventive principles of this patent disclosure, a fifth-order maximally flat, low-pass filter may be implemented utilizing packaging parasitics.

Figure 17:
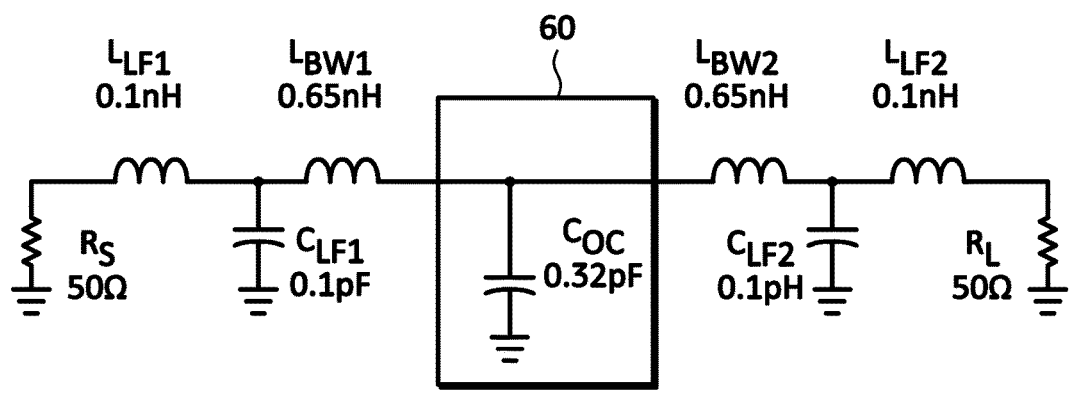
FIG. 17 illustrates another embodiment of a packaging arrangement according to some inventive principles of this patent disclosure.

FIG. 17 illustrates another embodiment of the packaging arrangement according to some inventive principles of this patent disclosure. The embodiment of FIG. 17 is similar to that of FIGS. 15 and 16 but includes inductances $L_{LF1}$ and $L_{LF2}$ of the lead frames and also illustrates some example values that provide a fifth-order maximally flat, low-pass filter with a −3 dB point at 20 GHz.

Buffered Detectors

In any of the embodiments described above, one or more of the detectors may include an input buffer according to some additional inventive principles of this patent disclosure. For example, a detector may include a unity-gain buffer to improve the common mode rejection by eliminating some or all of the common mode portion of the input signal to the detector. These same buffers could also be used to bring out the detected signals in applications where amplitude and phase information needs to be preserved as in the case of a vector network analyzer (VNA).

Switched Detectors

Figure 18:
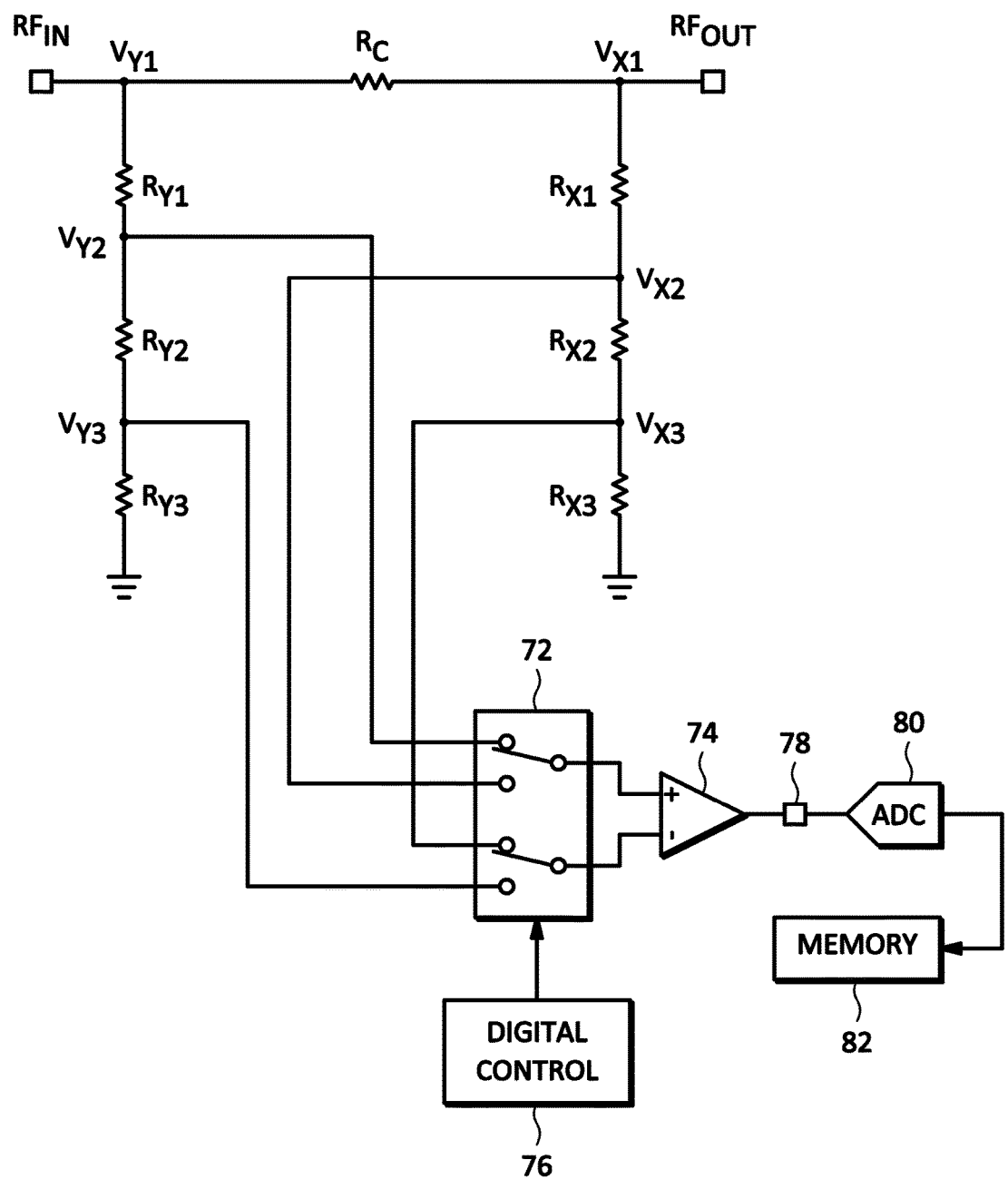
FIG. 18 illustrates an embodiment of a bi-directional bridge having a switched detector according to some inventive principles of this patent disclosure.

FIG. 18 illustrates an embodiment of a bi-directional bridge having a switched detector according to some inventive principles of this patent disclosure. The embodiment of FIG. 18 includes a bi-directional bridge having resistors $R_C$, $R_{Y1}$, $R_{Y2}$, $R_{Y3}$, $R_{X1}$, $R_{X2}$ and $R_{X3}$ as in embodiments described above. Rather than including two detectors, however, a two-pole, double-throw switch circuit 72 is used to selectively couple the differential inputs of a single detector 74 to the nodes that enable it to measure either the forward or reverse traveling signals in response to a digital control circuit 76 having a user interface such as a serial peripheral interface (SPI) port.

The output of the detector may be brought out to a user-accessible terminal 78. Thus, the user may implement a time-multiplexed measurement scheme in which the switch circuit 72 alternately re-connects the detector 74 to measure the forward or reverse traveling signals, which then receive further processing by the user.

The embodiment of FIG. 18 may be beneficial in applications where the forward or reverse traveling signals do not need to be measured exactly simultaneously. By reducing the number of detectors, this embodiment may enable a substantial reduction in power consumption and dissipation, complexity, chip space, etc.

In some embodiments, an optional analog-to-digital converter (ADC) 80 may be included to provide the user with the output in a digital form. A memory 82 may also be included to store the digitized values of the forward and reverse signals.

In some additional embodiments, an additional switch circuit may be included and operated as dummy switches that are connected to the otherwise unconnected nodes to keep the effective loading on all nodes constant regardless of which set of signals is being measured.

Figure 19:
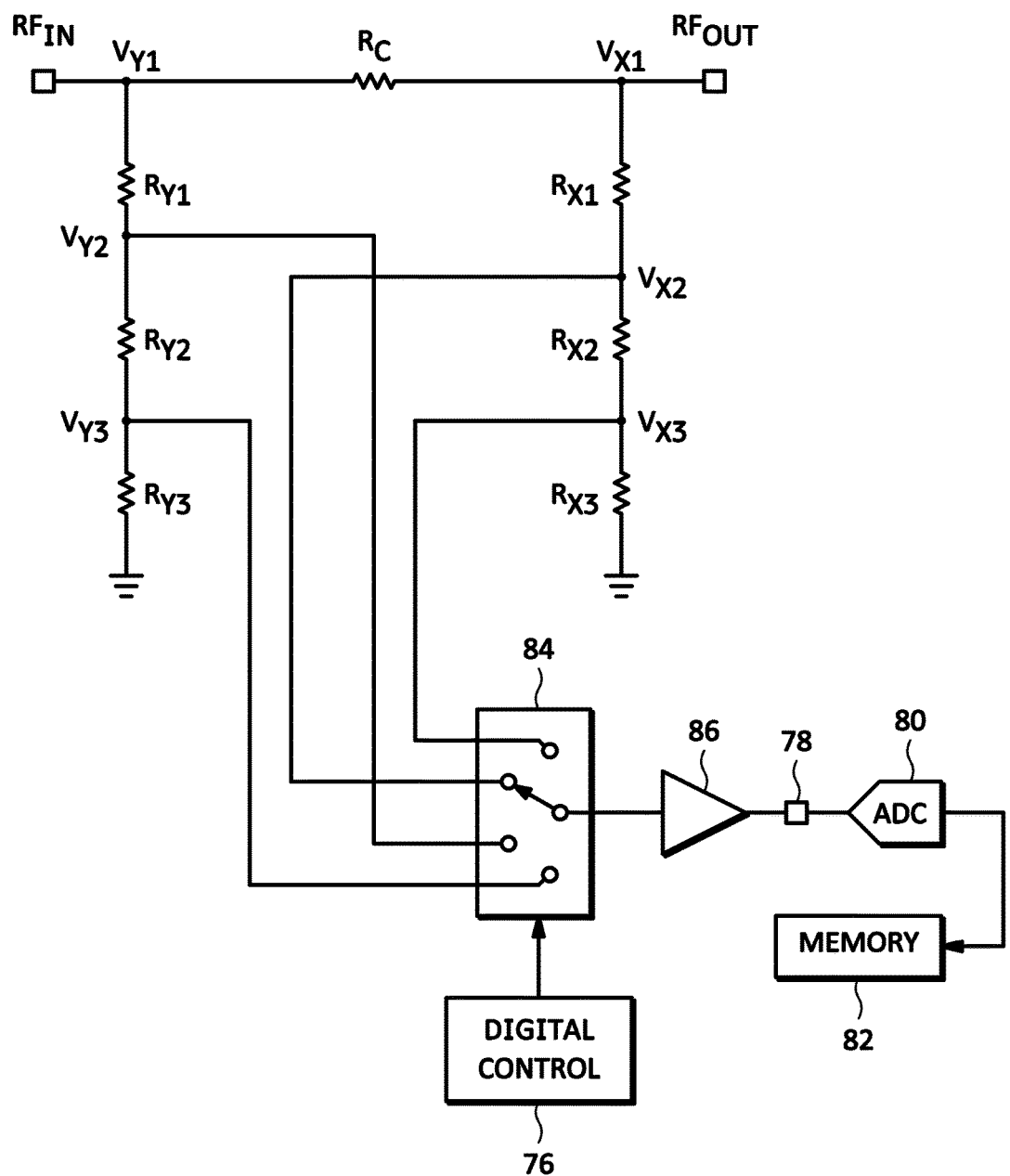
FIG. 19 illustrates another embodiment of a bi-directional bridge having a switched detector according to some inventive principles of this patent disclosure.

FIG. 19 illustrates another embodiment of a bi-directional bridge having a switched detector according to some inventive principles of this patent disclosure. The embodiment of FIG. 19 includes a bi-directional bridge similar to that of FIG. 18, but instead of a double-pole, double-throw switch, a four-pole, single-throw switch 84 is arranged to individually couple the input of a single-ended detector 86 to each of the four measurement nodes in response to a digital control circuit 76. The values of $V_F$ and $V_R$ may then be obtained by subtracting $V_{X3}$ from $V_{Y2}$ and $V_{Y3}$ from $V_{X2}$, respectively. An optional ADC 80 may be included along with an optional memory 82.

Integral Multi-Tap Attenuators and
Signal-Responsive Steering

Some additional inventive principles of this patent disclosure relate to a synergistic integration of multi-tap attenuators and steering circuits into a bi-directional bridge.

Multi-tap attenuators and steering circuits are utilized in some types of variable gain amplifiers (VGAs) such as the X-AMP® architecture. An example is illustrated in FIG. 8 of U.S. Pat. No. 7,495,511 which has a common inventor with this patent disclosure and is incorporated by reference. The input signal is applied to an attenuator network. Attenuated versions of the input signal are available at tap points along the attenuator. A steering circuit, typically based on a series of transconductance (gm) cells controlled by an interpolator, selects the signals from one or more tap points and feeds them to a fixed gain amplifier. By selecting various tap points along the attenuator and merging the signals from adjacent tap points, the steering circuit provides continuously variable gain control. The steering circuit may alternatively be controlled by a series of binary signals, instead of interpolator signals, to provide discrete gain steps.

According to some of the inventive principles, one or more multi-tap attenuators and accompanying steering circuits may be used to implement all or a portion of one or more of the strings of shunt resistors in a bi-directional bridge. In addition to enabling the multi-tap attenuator to serve the dual purpose of shunt string, this configuration offers additional inherent benefits as described in more detail below.

Figure 20:
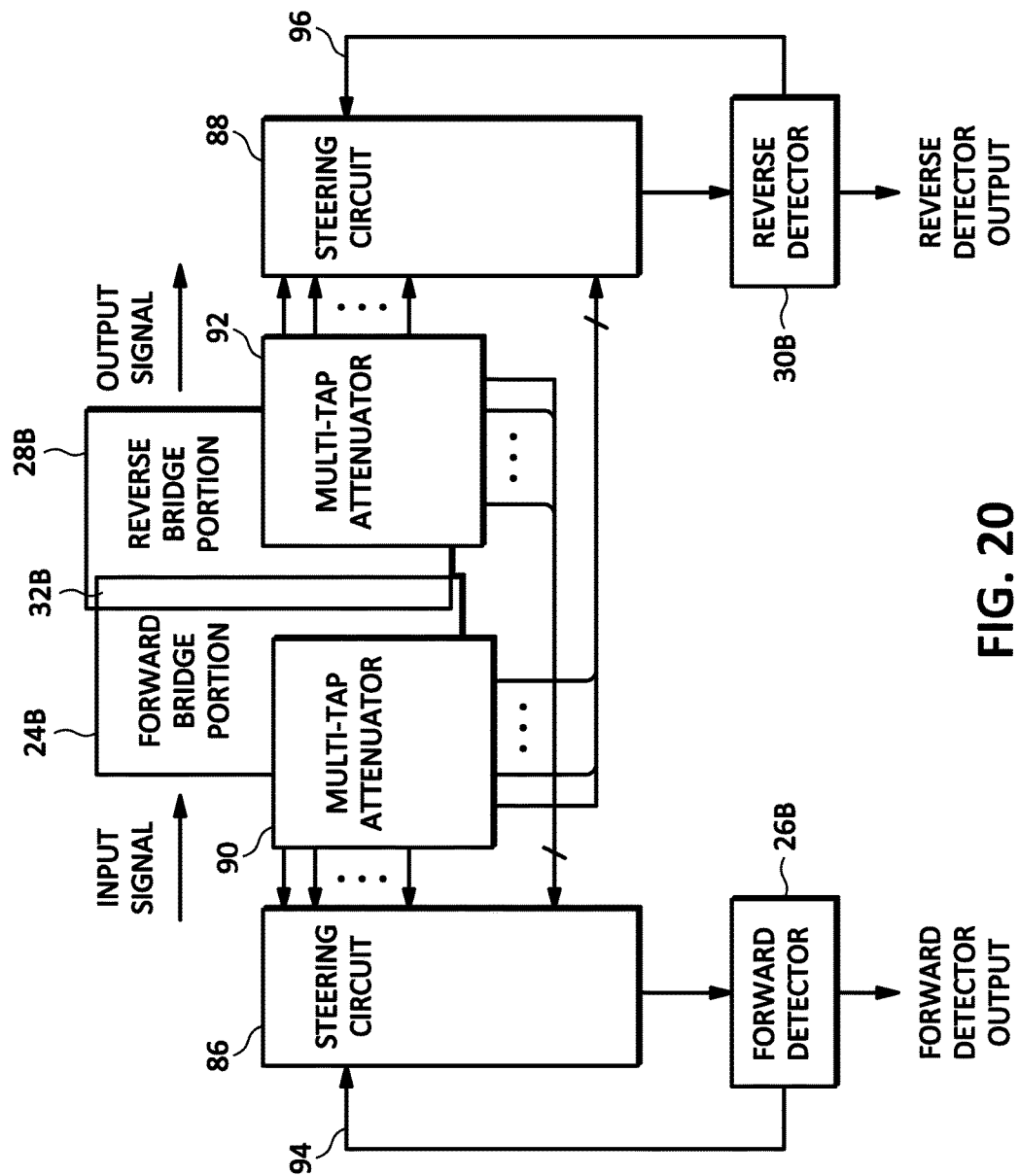
FIG. 20 illustrates an embodiment of a bi-directional bridge having integral multi-tap attenuators and signal-responsive steering according to some inventive principles of this patent disclosure.

FIG. 20 illustrates an embodiment of a bi-directional bridge having integral multi-tap attenuators and signal-responsive steering according to some inventive principles of this patent disclosure. The embodiment of FIG. 20 includes a bi-directional bridge having a forward portion 24B, a reverse portion 28B and a shared portion 32B. A multi-tap attenuator 90 is used to implement all or part of the forward bridge portion 24B, while another multi-tap attenuator 92 is used to implement all or part of the reverse bridge portion 28B. A first steering circuit 86 selectively connects a forward detector 26B to suitable taps on both multi-tap attenuators 90 and 92, while a second steering circuit 88 connects a reverse detector 30B to suitable taps on both multi-tap attenuators 90 and 92.

The multi-tap attenuators 90 and 92 may be implemented in any suitable form, for example, as resistive strings, ladders or other types of networks. They may be realized as single-sided or differential structures, etc. The steering circuits may be implemented to provide continuous or discrete steering, i.e., with interpolated or binary switching. Like the attenuators, they may be realized as single-sided or differential structures, etc.

Feedback paths 94 and 96 may be included to enable the steering circuits 86 and 88 to respond to any suitable signal levels such as the levels of the input signal and/or output signal to/from the bi-directional bridge, a setpoint signal level, reference signal level, etc. For example, the feedback paths 94 and 96 may be arranged to servo the steering circuit to control the gain of a power amplifier in a controller configuration, or to provide a scaled output reading when arranged in a measurement configuration.

Figure 21:
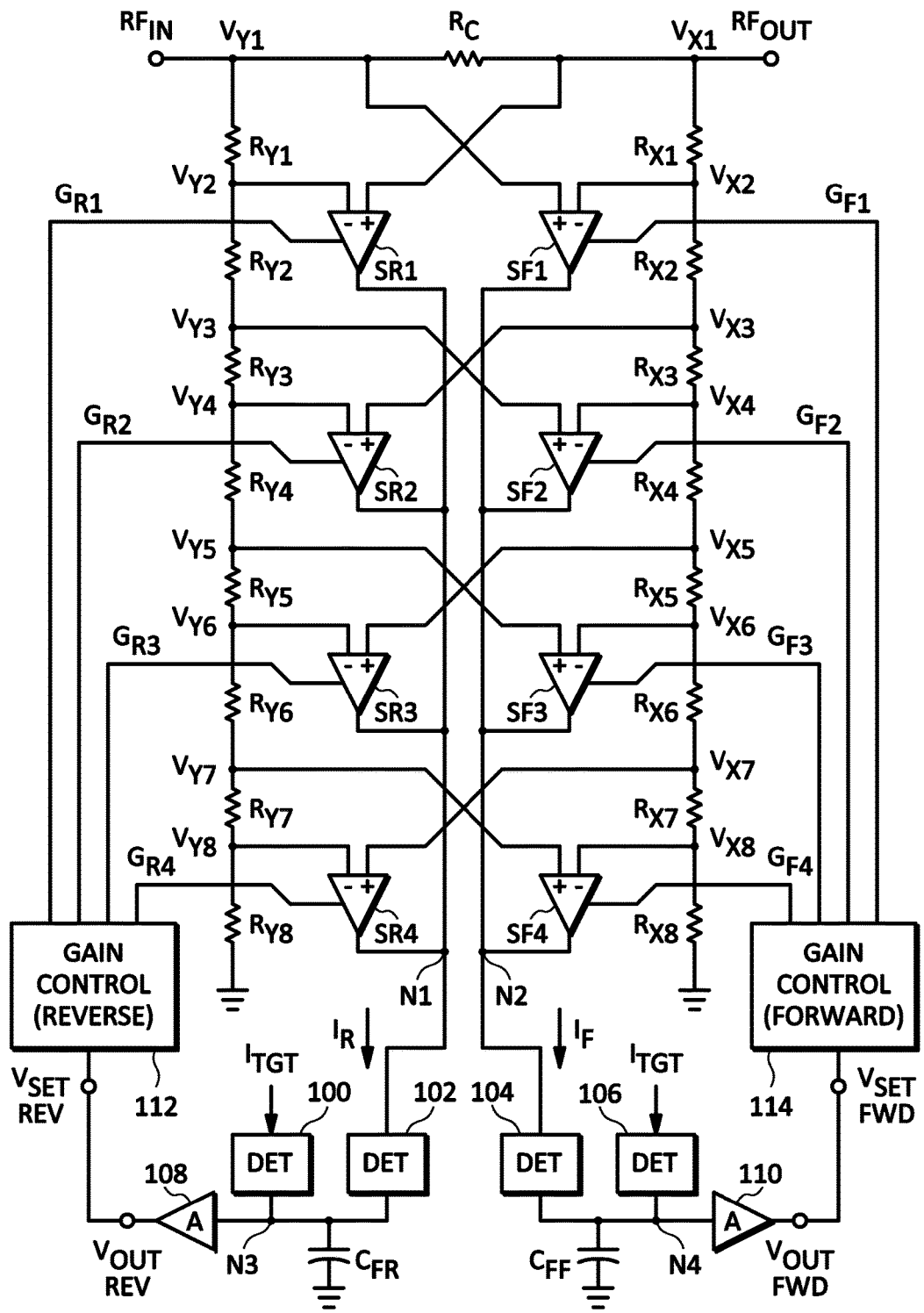
FIG. 21 illustrates an example embodiment of a bi-directional bridge according to some inventive principles of this patent disclosure.

FIG. 21 illustrates an example embodiment of a bi-directional bridge according to some inventive principles of this patent disclosure. The embodiment of FIG. 21 is one example of a more detailed implementation of the embodiment of FIG. 20. In the embodiment of FIG. 21, the Y and X shunt paths are implemented as a multi-tap attenuators $R_{Y1}$-$R_{Y8}$ and $R_{X1}$-$R_{X8}$, respectively.

A first steering circuit includes steering cells SR1-SR4 that can be selectively enabled and disabled, fully or partially, in response to reverse gain control signals $G_{R1}$-$G_{R4}$. A second steering circuit includes steering cells SF1-SF4 that can be selectively enabled and disabled, fully or partially, in response to forward gain control signals $G_{F1}$-$G_{F4}$. The steering cells may be implemented as transconductance (gm) cells, and the gain control signals may be implemented as bias signals for the gm cells. The bias signals may be fully switched to provide discrete gain steps or interpolated to provide partial switching for continuous gain control.

The outputs of the first steering cells SR1-SR4, which in this example may be current outputs from transconductance cells, are combined at a first summing node N1 and applied to a reverse detector cell 102. The outputs of the second steering cells SF1-SF4 are combined at a second summing node N2 and applied to a forward detector cell 104.

A second reverse detector cell 100 is matched to the first reverse detector cell 102 and receives a target current $I_{TGT}$. One of the two reverse detector cells is configured to provide an output of opposite polarity as the other so that the difference between the outputs of the two reverse detector cells is obtained at a summing node N3. The difference is integrated by a filter capacitor $C_{FR}$ to generate a voltage which is buffered by output buffer 108 and appears as the reverse detector output $V_{OUT}$REV. A similar arrangement of matched forward detector cells 104 and 106 generate a difference current at summing node N4 which is integrated by a filter capacitor $C_{FF}$ to generate a voltage which is buffered by output buffer 110 and appears as the forward detector output $V_{OUT}$FWD.

The detector cells may be implemented with any suitable circuitry including diode detectors and relatively simple transistor squaring cells such as transconductance squaring cells and translinear squaring cells, as well as more complex detectors such as logarithmic amplifiers (log amps), complete RMS detector subsystems, etc. In the example embodiment of FIG. 21, the detector cells are implemented as relatively simple translinear squaring cells which can receive the outputs IR and IF from the steering circuits directly as current mode signals.

The reverse and forward gain control circuits 112 and 114 can be implemented with any suitable circuitry. For example, in an embodiment with continuous gain control, the gain control circuits may be implemented with interpolators that generate a series of interpolator currents which may be used as gain control signals $G_{R1}$-$G_{R4}$ and $G_{F1}$-$G_{F4}$ in response to input voltage signals $V_{SET}$ REV and $V_{SET}$ FWD, respectively.

In the embodiment of FIG. 21, the reverse detector output $V_{OUT}$ REV is connected to the reverse gain control input $V_{SET}$ REV, and the forward detector output $V_{OUT}$ FWD is connected to the forward gain control input $V_{SET}$ FWD. This configures the system in a measurement mode with the forward and reverse detector outputs provided at $V_{OUT}$ FWD and $V_{OUT}$ REV, respectively. This causes the feedback paths through the gain control circuits to servo each side of the system so that the optimal steering cell or cells are activated or selected depending on the levels of the signals applied to the attenuators. The system can alternatively be configured in a controller mode with setpoint signals applied to $V_{SET}$ REV and $V_{SET}$ FWD. In either configuration, scaling is provided by the signal $I_{TGT}$ which may provide a reference level for scaling the outputs $V_{OUT}$ FWD and $V_{OUT}$ REV.

An advantage of the system of FIG. 21 is that the multi-tap attenuators provide inherent level-shifting for large input signals while still providing good sensitivity for smaller input signals. For example, when a large input signal is applied to $V_{Y1}$, a relatively large voltage appears at $V_{Y2}$ and to a decreasing extent at $V_{Y4}$ and $V_{Y6}$. The reverse gain control loop servos the system so that steering cells SR1-SR3 (which in this example are gm cells) are turned off and steering cell SR4 is turned on to measure the largely attenuated, but still easily detectable, signal at $V_{Y8}$. The common mode voltage at SR4 is never a problem because the signal applied to $V_{Y1}$ is always highly attenuated by the time it appears at $V_{Y8}$. Although a relatively high common mode voltage appears at $V_{Y2}$, and to a decreasing extent at $V_{Y4}$ and $V_{Y6}$, cells SR1-SR3 are turned off due to the operation of the servo loop. Therefore, the relatively high common mode voltages are not a problem at steering cells SR1-SR3, which are limited only by their breakdown voltages.

In contrast, when a relatively small voltage is applied to $V_{Y1}$, the reverse gain control loop servos the system so that steering cells SR2-SR4 are turned off and steering cell SR1 is turned on to measure the signal at $V_{Y2}$ with relatively little attenuation.

Thus, the system of FIG. 21 eliminates problems with common mode signal levels while still maintaining high levels of sensitivity for measuring small differential input signals.

An additional advantage of the embodiment of FIG. 21 is that the relatively simple attenuator strings may require the use of few resistors compared to other attenuator arrangements, thereby resulting in reduced parasitic capacitance and increased bandwidth.

To provide convenient scaling, the values of $R_{Y1}$-$R_{Y8}$ and $R_{X1}$-$R_{X8}$ can be related to normalized values $R_1$ and $R_2$ as follows:

$R_{Y1}$, $R_{X1}$=$2R_1$
$R_{Y2}$, $R_{X2}$=$2R_2$
$R_{Y3}$, $R_{X3}$=$R_1$
$R_{Y4}$, $R_{X4}$=$R_2$
$R_{Y5}$, $R_{X5}$=$R_1/2$
$R_{Y6}$, $R_{X6}$=$R_2/2$
$R_{Y7}$, $R_{X7}$=$R_1/4$
$R_{Y8}$, $R_{X8}$=$R_2/4$

Figure 22:
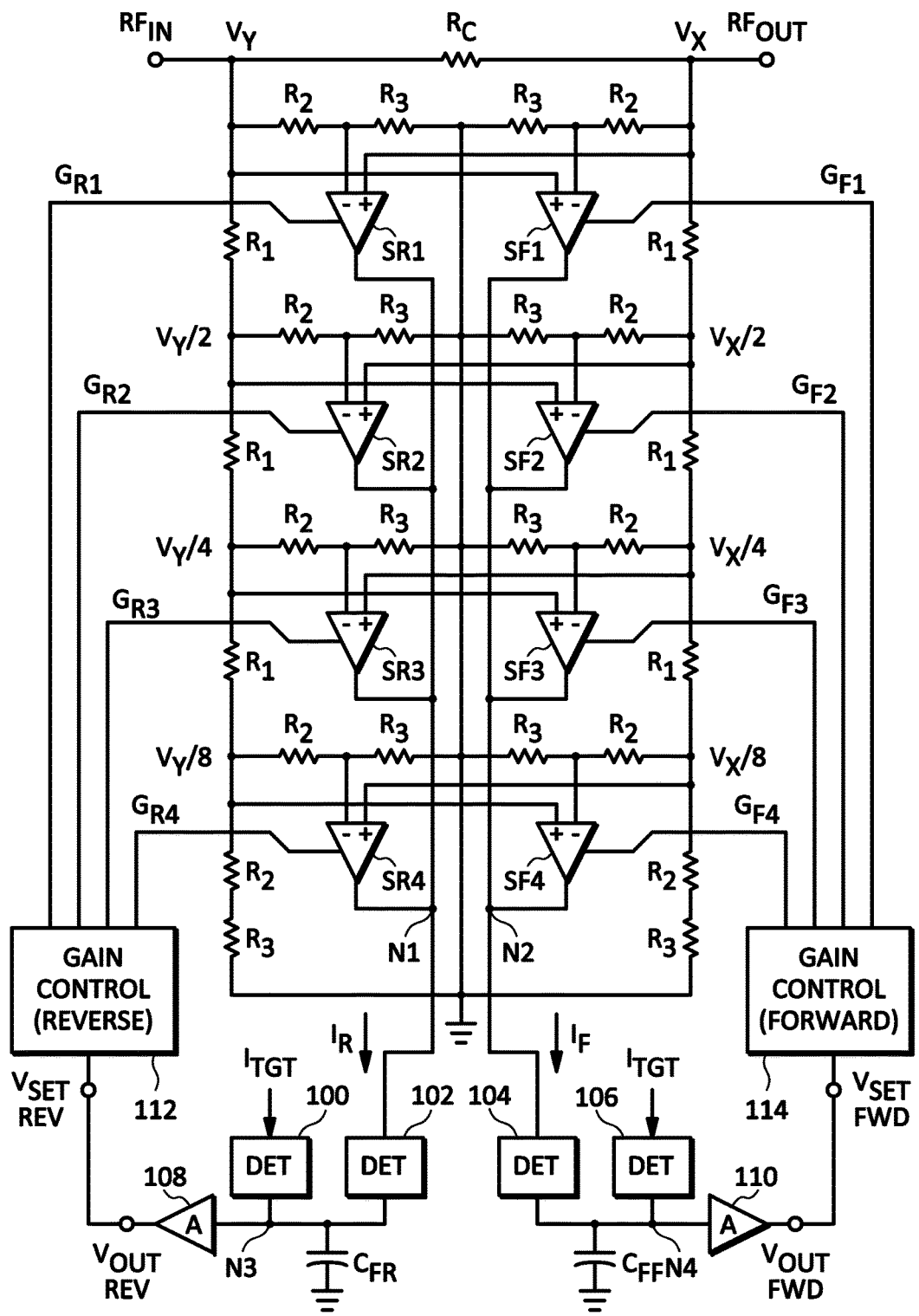
FIG. 22 illustrates another example embodiment of a bi-directional bridge according to some inventive principles of this patent disclosure.

This provides a binarily weighted voltage distribution along the attenuator strings as follows:

$V_{Y3}$=$V_{Y1}/2$
$V_{Y5}$=$V_{Y1}/4$
$V_{Y7}$=$V_{Y1}/8$
and
$V_{X3}$=$V_{X1}/2$
$V_{X5}$=$V_{X1}/4$
$V_{X7}$=$V_{X1}/8$ Some example values for a system having 50 ohm input and output impedance are $R_C$=5Ω, $R_1$=47.5Ω and $R_2$=202.5Ω. This provides a voltage distribution as follows:

$V_{Y1}$=$0.905V_{X1}$
$V_{Y2}$=$0.905V_{Y1}$
$V_{Y4}$=$0.905V_{Y1}/2$
$V_{Y6}$=$0.905V_{Y1}/4$
$V_{Y8}$=$0.905V_{Y1}/8$
and
$V_{X1}$=$0.905V_{Y1}$
$V_{X2}$=$0.905V_{X1}$
$V_{X4}$=$0.905V_{X1}/2$
$V_{X6}$=$0.905V_{X1}/4$
$V_{X8}$=$0.905V_{X1}/8$ FIG. 22 illustrates another example embodiment of a bi-directional bridge according to some inventive principles of this patent disclosure. The embodiment of FIG. 22 is similar to that of FIG. 21, but the attenuator strings are replaced with attenuator ladders. Although any suitable attenuator ladders may be used, the embodiment of FIG. 22 is implemented with R-2R ladders to provide a binarily weighted voltage distribution along the attenuators. To provide suitable tap points for the steering cells, the "2R" rungs of the ladders are split into resistive dividers in which $R_2$+$R_3$=$2R_1$. Some example values for a system having 50 ohm input and output impedance are $R_C$=5Ω, $R_1$=1KΩ, $R_2$=190Ω and $R_3$=1.81KΩ.

An advantage of the embodiment of FIG. 22 is that it utilizes a repetitive structure that enables the use of unit resistors which simplifies the layout on an integrated circuit.

The inventive principles of this patent disclosure have been described above with reference to some specific example embodiments, but these embodiments can be modified in arrangement and detail without departing from the inventive concepts.

The invention claimed is:

1. A bi-directional measurement circuit comprising:
   an RF input terminal;
   an RF output terminal;
   a forward component;
   a reverse component;
   a forward bridge portion coupled between the RF input terminal and the RF output terminal and arranged to divert a portion of the power flowing from the RF input terminal to the RF output terminal to the forward component; and
   a reverse bridge portion coupled between the RF input terminal and the RF output terminal and arranged to divert a portion of the power flowing from the RF output terminal to the RF input terminal to the reverse component;
   wherein:
   the forward component is coupled to the forward bridge portion,
   the reverse component is coupled to the reverse bridge portion, the forward bridge portion comprises a first shunt path coupled to the RF output terminal, the reverse bridge portion comprises a second shunt path coupled to the RF input terminal, and the forward bridge portion and the reverse bridge portion each include an electrical pathway through a shared portion, the shared portion is arranged to function simultaneously as part of the forward bridge portion and as part of the reverse bridge portion, and the shared portion comprises a resistor coupled between the RF input terminal and the RF output terminal.

2. The circuit of claim 1, wherein:

the first shunt path comprises a first resistor coupled between the RF output terminal and a first node, and a second resistor coupled between the first node and a second node; and the second shunt path comprises a third resistor coupled between the RF input terminal and a third node, and a fourth resistor coupled between the third node and a fourth node.

3. The circuit of claim 2, wherein:

the forward component is coupled between the RF input terminal and the first node; and the reverse component is coupled between the RF output terminal and the third node.

4. The circuit of claim 1, further comprising an interface circuit coupled between the forward and reverse bridge portions and the forward and reverse components.

5. The circuit of claim 4, wherein the interface circuit is arranged to level shift the signals applied to the forward and reverse components.

6. The circuit of claim 1, wherein:

the first shunt path comprises a first resistor coupled between the RF output terminal and a first node, a second resistor coupled between the first node and a second node, and a third resistor coupled between the second node and a third node; and the second shunt path comprises a fourth resistor coupled between the RF input terminal and a fourth node, a fifth resistor coupled between the fourth node and a fifth node, and a sixth resistor coupled between the fifth node and a sixth node.

7. The circuit of claim 6, wherein:

the reverse component is coupled between the first node and the fifth node; and the forward component is coupled between the second node and the fourth node.

8. The circuit of claim 7, wherein the third and sixth nodes comprise AC grounds.

9. The circuit of claim 1, wherein the forward and reverse bridge portions are arranged to provide current mode inputs to the forward and reverse components.

10. The circuit of claim 1, wherein:

the forward component includes a forward linear buffer amplifier and a forward detector, and the forward linear buffer amplifier is coupled between the forward bridge portion and the forward detector; and the reverse component includes a reverse linear buffer amplifier and a reverse detector, and the reverse linear buffer amplifier is coupled between the reverse bridge portion and the reverse detector.

11. The circuit of claim 1, wherein the forward component includes a forward linear amplifier, and the reverse component includes a reverse linear amplifier.

12. The circuit of claim 1, wherein the forward component includes a forward detector, and the reverse component includes a reverse detector.

13. A method of measuring an amount of radio frequency (RF) power in a signal, comprising:

measuring a forward power of the signal with forward detection circuitry; and measuring a reverse power of the signal with reverse detection circuitry, wherein the forward detection circuitry and the reverse detection circuitry includes circuitry shared between the forward detection circuitry and the reverse detection circuitry such that the forward detection circuitry and the reverse detection circuitry each include an electrical pathway through the shared circuitry, and the shared circuitry includes a resistor;

wherein measuring the forward power of the signal comprises converting a current-mode signal to a voltage-mode signal, or converting a voltage-mode signal to a current-mode signal.

14. The method of claim 13, wherein measuring the forward power of the signal comprises level-shifting the signal.

15. The method of claim 13, wherein measuring the forward power of the signal comprises attenuating the signal.

16. The method of claim 13, further comprising:

determining a voltage standing wave ratio (VSWR) based on the forward power and the reverse power.

17. The method of claim 13, further comprising:

receiving the signal from an output of a power amplifier (PA).

18. A radio frequency (RF) transmission system, comprising:

an RF input terminal;

an RF output terminal; and a measurement circuit coupled between the RF input terminal and the RF output terminal, wherein the measurement circuit includes:

a forward bridge coupled between the RF input terminal and the RF output terminal, wherein the forward bridge is to divert, to a forward detector, a portion of the power flowing from the RF input terminal to the RF output terminal, and a reverse bridge coupled between the RF input terminal and the RF output terminal, wherein the reverse bridge is to divert, to a reverse detector, a portion of the power flowing from the RF output terminal to the RF input terminal, wherein:

the forward bridge is coupled to the forward detector, the reverse bridge is coupled to the reverse detector, the forward bridge and the reverse bridge each include an electrical pathway through circuitry shared between the forward bridge and the reverse bridge, a first input terminal of the forward detector is coupled to a first node in a first resistor network, and a second input terminal of the forward detector is coupled to a first node in a second resistor network, a first input terminal of the reverse detector is coupled to a second node in the first resistor network, and a second input terminal of the reverse detector is coupled to a second node in the second resistor network, and the circuitry shared between the forward bridge and the reverse bridge is coupled between the first and second resistor networks.

19. The RF transmission system of claim 18, further comprising:
an RF signal source coupled to the RF input terminal.

20. The RF transmission system of claim 18, wherein the portion of the power diverted to the forward detector is within a common mode rejection range of the forward detector.

21. The RF transmission system of claim 19, wherein the RF signal source includes a power amplifier (PA).

22. The RF transmission system of claim 18, further comprising:
an antenna coupled to the RF output terminal.

23. The bi-directional measurement circuit of claim 1, further comprising a power amplifier to which the RF input terminal is coupled.

24. The bi-directional measurement circuit of claim 1, further comprising an antenna to which the RF output terminal is coupled.

25. The circuit of claim 2, wherein:
the forward component is coupled between the RF input terminal and the second node; and
the reverse component is coupled between the RF output terminal and the fourth node.

26. The circuit of claim 25, wherein:
the forward component is coupled between the third node and the fourth node; and
the reverse component is coupled between the first node and the fourth node.

27. The circuit of claim 26, further comprising:
a fifth resistor coupled between the first node and the reverse component; and
a sixth resistor coupled between the third node and the forward component.

28. The RF transmission system of claim 18, wherein the first resistor network includes a first resistor and a second resistor in series between the RF output terminal and the first node of the first resistor network, and the first resistor network includes a third resistor coupled between the first resistor and the second node of the first resistor network.

29. The RF transmission system of claim 28, wherein the second resistor network includes a fourth resistor and a fifth resistor in series between the RF input terminal and the second node of the second resistor network, and the second resistor network includes a sixth resistor coupled between the fourth resistor and the first node of the second resistor network.

* * * * *